United States Patent [19]
Dynes et al.

[11] Patent Number: 5,364,836
[45] Date of Patent: Nov. 15, 1994

[54] ARTICLE COMPRISING A SUPERCONDUCTOR/INSULATOR LAYER STRUCTURE, AND METHOD OF MAKING THE ARTICLE

[75] Inventors: Robert C. Dynes, Summit; Elliot H. Hartford, Jr., New Providence; Eric S. Hellman, Montclair; Andrew N. Pargellis, Hoboken; Fred Sharifi, Scotch Plains, all of N.J.

[73] Assignee: AT&T Bell Laboratories, Murray Hill, N.J.

[21] Appl. No.: 28,738

[22] Filed: Mar. 8, 1993

Related U.S. Application Data

[63] Continuation of Ser. No. 630,134, Dec. 19, 1990, abandoned.

[51] Int. Cl.$^5$ ................................................ B32B 9/00
[52] U.S. Cl. .................................. 505/190; 428/688; 428/210; 257/31; 257/33; 505/701; 505/702; 505/238
[58] Field of Search ............... 428/688, 689, 930, 210, 428/209; 505/1, 701–704; 427/63; 257/35, 36, 39, 31, 33

[56] References Cited

U.S. PATENT DOCUMENTS

| | | | |
|---|---|---|---|
| 4,316,785 | 2/1982 | Suzuki | 427/63 |
| 4,933,317 | 6/1990 | Johnson et al. | 505/1 |
| 4,948,779 | 8/1990 | Keur et al. | 505/703 |
| 4,965,244 | 10/1990 | Weaver et al. | 505/1 |
| 4,980,339 | 12/1990 | Setsune et al. | 505/1 |
| 4,983,570 | 1/1991 | Creuzet et al. | 505/1 |
| 4,994,435 | 2/1991 | Shiga et al. | 505/1 |

FOREIGN PATENT DOCUMENTS 0397186  11/1990  European Pat. Off. .

OTHER PUBLICATIONS

LeDul et al., IEEE Trans. on Magnetics, vol. Mag 23 No. 2, Mar. 1987, pp. 863–865.
Ruggiero ed., Superconducting Devices, Academic Press pp. 358–390, Jul. 24, 1990.
Sahu, "Overview of High T Superconductivity", in High Tc Superconductors II, ACS, 1988, Chapter 1.
Morris, et al., "Stability of 123, 124, & 247 Superconductors" Physica C 159 (1989) 287–294.
Science vol. 240, Apr. 1988, pp. 25–27 "Superconductors Materials Problems".
Gurvitch et al., Mat. Res. Soc. Symp. Proc. vol. 99, 1988.
Sastry et al., 8323 Physica C/Superconductivity 157(1989) 1 Mar. No. 3, Amsterdam NL.
Yoshrara et al., Jap Journ. App Phys vol. 27 No. 8 Aug. 1988 L1492-4.
Radpour et al., Appl. Phys. Lett (54)(24) Jun. 1989.
Huang et al., Appl Phys. Lett. 57 (22) Nov. 1990.
Hellman et al., J. Vac. Sci. Technol. 138(2), Mar./Apr. 1990.

(List continued on next page.)

*Primary Examiner*—Patrick J. Ryan
*Assistant Examiner*—Patrick R. Jewik
*Attorney, Agent, or Firm*—Eugen E. Pacher

[57] ABSTRACT

Disclosed is an article that comprises a superconductor-insulator (s-i) layer structure. The superconductor material has nominal composition $Ba_{1-x}M_xBiO_{3-y}$ (M is K, Rb, or K and Rb, $0.35 < x \lesssim 0.5$, $0 < y \lesssim 0.25$). In some preferred embodiments the insulator is a Ba- and Bi containing oxide, exemplarily $BaBi_2O_4$, $Ba_{1-x}M_xBiO_3$ ($0 \leq x < 0.35$), or $Ba_{1-x}Bi_{1+x}O_3$ ($0 \leq x \lesssim 0.5$). In other embodiments the insulator is an insulating oxide with the NaCl structure (e.g., $Mg_{1-x}Ca_xO$), an insulating perovskite (e.g., $BaZrO_3$), an insulator with the $K_2NiF_4$ structure (e.g., $Ba_2PbO_4$), an insulating fluoride with the $BaF_2$ structure (e.g., $Ba_{1-x}Sr_xF_2$), or an insulating fluoride with the NaCl structure (e.g., LiF). Disclosed are also advantageous methods of making an article according to the invention. S-i layer structures can form substantial ideal BCS superconducting tunnel junctions at temperatures that can be reached without the use of liquid He, typically with a closed cycle refrigerator.

9 Claims, 3 Drawing Sheets

OTHER PUBLICATIONS

Hellman et al., Appl Phys. Lett 55(20) Nov. 1989.

Kovadova et al., Mat. Res. Bull., vol. 24, 1989, pp. 1295–1302.

F. S. Galasso, Structure and Properties of Inorganic Solids, Pergamon Press, N.Y., 1970, pp. 63, 64, 177–190.

"Superconductivity of Screen-Printed $YBa_2Cu_3O_y$ Thick Films on $Y_2BaCuO_5$ Substrates", K. Yoshiara, et al., Jap. J. Appl. Phys., vol. 27, Aug. 1988, pp. L1492–1494.

"Preparation of Superconducting Y–Ba–Cu–O Thick Film", M. Itoh, and H. Ishigaki, Jap. J. Appl. Phys., vol. 27, pp. L420–422, Mar. 1988.

"Optical Detector Using Superconducting $BaPb_{0.7}Bi_{0.3}O_3$ (BPB) Thin Films", by Y. Enomoto et al., Japanese Journal of Applied Physics, vol. 24 (1985) Supplement 24-2, pp. 471–473.

"All-high $T_c$ Josephson Tunnel Junction: $Ba_{1-x}K_xBiO_3/Ba_{1-x}K_xBiO_3$ Junctions", by A. N. Pargellis et al., Applied Physics Letters, 58(1), 7 Jan. 1991, pp. 95–96.

"Molecular Beam Epitaxy of Superconducting (Rb,Ba)-$BiO_3$", by E. S. Hellman et al., Applied Physics Letters, 55(20), 13 Nov. 1989, pp. 2120–2122.

European Search Report, The Hague, 25 Sep. 1992.

"Superconductivity near 30 K without copper: the $Ba_{0.6}K_{0.4}BiO_3$ Perovskite", R. J. Cava, B. Batlogg, J. J. Krajewski, R. Farrow, L. W. Rupp, Jr., A. E. White, K. Short, W. F. Peck & T. Kometani, Nature, vol. 332 28, Apr. 1988.

"Electron Tunneling into single Crystals of $YBa_2Cu_3O_{7-\delta}$", J. M. Valles, Jr., M. Gurevitch, M. Cucolo, R. C. Dynes, J. P. Garno, L. F. Schneemeyer, and J. V. Wasczcak, Mat. Res. Soc. Symp. Proc. vol. 169, 1990.

"Molecular Beam Epitaxy of Superconducting (RbBa)-$BiO_3$", E. S. Hellman, E. H. Hartford and R. M. Fleming, Appl. Phys. Lett. 55, vol. 20, 1989.

"Adsorption controlled molecular beam epitaxy of rubidium barium bismuth oxide," E. S. Hellman and E. H. Hartford, J. Vac. Sci. Technol. B, vol. 8 (2) 1990.

"Ideal Tunneling Characteristics in $Ba_{1-x}K_xBiO_3$ point-contact junctions with Au and Nb tips", O. Huang, J. F. Zasadzinski, K. E. Gray, D. R. Richards and D. G. Hinks, Appl. Phys. Lett vol. 57 (22) 1990.

3,364,836

ARTICLE COMPRISING A SUPERCONDUCTOR/INSULATOR LAYER STRUCTURE, AND METHOD OF MAKING THE ARTICLE

This application is a continuation of application Ser. No. 07/630,134, filed on Dec. 19, 1990, now abandoned.

FIELD OF THE INVENTION

This application pertains to apparatus that comprises a superconductor/insulator layer structure, and to methods of making such an article.

BACKGROUND OF THE INVENTION

Superconductor/insulator (s-i) layer structures are of interest in a variety of applications. For instance, it has long been recognized that the performance limits of some categories of electronic equipment (e.g., signal processors, computers) could be substantially improved if their circuitry could comprise superconductive tunnel junctions (STJs, frequently referred to as "Josephson" junctions). As is well known, STJs comprise a superconductor/insulator/superconductor (s-i-s) layer structure. For a review of STJs see, for instance, "Applied Superconductivity", Vol. 1, V. L. Newhouse, editor, Academic Press, 1975, incorporated herein by reference.

Prior to 1987 essentially all of the relevant effort was directed towards STJs which used metal (generally elemental metal or alloys, e.g., Pb, Nb, Pb-In-Au alloy) electrodes. However, the prior an technology has not found significant commercial use, at least in pan due to the fact that all variants of the technology have operating temperatures below 10K. Recent advances in cryogenic engineering have resulted in commercially available closed-cycle refrigerators which make temperatures down to about 10–12K readily and conveniently accessible. However, temperatures below 10K still can only be reached through use of liquid He. Liquid He not only is relatively expensive but, probably more importantly, is rather inconvenient to use, requiring special facilities and techniques.

Starting in 1986, superconductors were discovered that had critical temperatures ($T_c$) higher than previously known superconductors. Most of these "high $T_c$" superconductors were cuprates. Exemplary are La-Ba-Cu-oxide, Y-Ba-Cu-oxide, Tl-Ba-Ca-Cu-oxide, and Bi-Pb-Sr-Ca-Cu-oxide. New non-cuprate oxide superconductors were also discovered. See U.S. Pat. No. 4,933,317, which discloses a superconductor of nominal composition $ABiO_3$ (with A being Ba and at least one monovalent element, exemplarily K), and R. J. Cava et at., *Nature*, Vol. 332, pp. 814–816, Apr. 28, 1988, both incorporated herein by reference. It is now known that material of composition $Ba_{1-x}K_xBiO_3$ ($x \sim 0.4$) can have $T_c \sim 30K$.

To date most high $T_c$-related development efforts have been directed towards cuprates and, in particular, towards cuprates having $T_c > 77K$. If STJs of good quality could be reliably manufactured in a cuprate system with $T_c > 77K$ then cooling could be readily accomplished with liquid $N_2$, or with a simple closed-cycle refrigeration system. However, even though tunnel junctions have been manufactured in $YBa_2Cu_3O_7$ and other high $T_c$ cuprates (see, for instance, J. M. Valles et al., *Materials Research Society Symposium Proceedings*, Vol. 169, pp. 983–986 (1990)), the behavior of these junctions typically departs substantially from that of an "ideal" BCS tunnel junction. In particular, these junctions frequently exhibit a relatively low (even zero) "Josephson" current, a substantial conductance at zero bias, and a tunneling density of states which is untypical of other superconductors.

In view of these characteristics it appears doubtful whether commercially useful circuits that comprise high $T_c$ cuprate-based s-i layer structures (e.g., STJs) will be reliably manufacturable. On the other hand, it would clearly be highly desirable to have available a technology that can reliably produce s-i layer structures that can, for instance, yield STJs that exhibit substantially ideal behavior at temperatures that can be reached without use of liquid He. This application discloses such a technology.

Glossary and Definitions

A "superconducting tunnel junction" (STJ) herein is a structure that comprises a s-i-s layer structure, with the thickness of the essentially uniform insulator layer that separates the two superconductor "electrodes" selected such that the respective superconducting wave functions of the electrodes overlap and quantum mechanical tunneling through the "barrier" can occur. A typical barrier thickness is about 2 nm.

A "BCS" superconducting tunnel junction herein is a STJ whose characteristics are in substantial agreement with the predictions that follow from the well known "BCS" theory of superconductivity. See, for instance, G. Rickayzen, "Theory of Superconductivity", Interscience Publishers, 1965.

The "Josephson" current ($I_c$) of a STJ is the DC current that can flow from electrode to electrode without a voltage drop across the dielectric layer.

By a "bismuthate" superconductor we mean herein a superconductor of nominal composition $Ba_{1-x}M_xBiO_{3-y}$, where M is K, Rb, or K and Rb, $0.35 < x \lesssim 0.5$, and $0 < y \lesssim 0.25$. Bismuthate superconductors have a cubic crystal lattice, with lattice constant in the range 0.426–0.430 nm, and have a perovskite ($ABO_3$) structure. As is well known, a perovskite has two inequivalent anion sites, generally referred to as "A-site" and "B-site", respectively. In bismuthate superconductors, essentially all of the Ba and M atoms occupy A-sites.

By a "epitaxy-relevant" lattice constant we mean herein the lattice constant of the overlying material that matches, or substantially matches, an orientation-determining periodicity of the substrate. This periodicity need not be a unit cell dimension but can be an appropriate multiple thereof. For instance, if the substrate has a cubic lattice then the crystal lattice of an epitaxial layer of cubic overlayer material can be rotated in the contact plane 45° with respect to the substrate lattice, if the unit cell of the overlayer material is about $\sqrt{2}$ times the unit cell of the substrate unit cell. This is the case for $BaF_2$ (unit cell 0.62 nm) on MgO (unit cell 0.421 nm). For simplicity's sake we will herein refer to the "orientation-determining periodicity" of the substrate as "the lattice constant" of the substrate.

Recited "nominal" compositions herein are intended to represent materials whose actual composition (for each element) is within ±10% of the nominal composition.

SUMMARY OF THE INVENTION

In a broad aspect our invention involves the recognition that some oxide superconductors which, for reason of their relatively low (compared to other high $T_c$ superconductors) transition temperatures $T_c$, have not previously been favored for commercial use by those skilled in the art could be advantageously used for s-i layer structures, including for STJs, and for articles that comprise circuitry and one or more STJs or other s-i structures. These superconductors are the bismuthate superconductors.

We have found that substantially ideal BCS STJs can be made with, exemplarily, $Ba_{0.6}K_{0.4}BiO_3$ electrodes. These STJs not only have highly non-linear I/V characteristics but also exhibit substantial Josephson current. This is markedly different from the behavior observed in cuprate-based STJs, which generally exhibit very low Josephson currents and do not exhibit a strong non-linearity in their I/V characteristics.

The invention is embodied in an article that comprises a bismuthate-containing s-i layer structure on a substrate. Exemplarily, the article comprises electronic circuitry on a substrate and, on at least a portion of the substrate, a s-i-s layer structure. Associated with the superconductor material of the layer structure is a transition temperature $T_c$, generally $15 \lesssim T_c \lesssim 60K$. The article exemplarily also comprises closed cycle refrigerator means adapted for cooling at least a portion of the substrate with the layer structure thereon to a temperature below $T_c$. The layer structure typically comprises a dielectric selected from (i), the Bi-and Ba- containing oxides, (ii), the oxides with the NaCl structure (e.g., $Mg_{1-x}Ca_xO$; $0 \leq x \lesssim 0.15$), (iii), the insulating perovskites (e.g., $BaZrO_3$), (iv), the insulators with the $K_2NiF_4$ structure (e.g., $Ba_2PbO_4$), (v.) the insulating fluorides with the $BaF_2$ structure (e.g., $Ba_{1-x}Sr_xF_2(0 \leq x \lesssim 0.35)$, and the (vi), insulating fluorides with the NaCl structure (e.g., LiF). The insulator materials of (i), (ii), (v), and (vi), advantageously have an epitaxy-relevant lattice constant that is within about 3% of the lattice constant of the substrate, and the insulator materials of (iii) and (iv) advantageously have an epitaxy-relevant lattice constant that is within about 6% of the lattice constant of the substrate. This facilitates epitaxial growth. Improved lattice match can frequently be obtained by deposition of a mixture of two or more appropriate dielectrics, e.g., CaO and MgO, or $BaF_2$ and $SrF_2$. Even though lattice match within about 3% is typically desirable, it is not a requirement in all cases. For instance, we have observed coherent epitaxy of $Ba_{1-x}K_xBiO_3$ on $LiBaF_3$, despite a 6% lattice mismatch. In general, we believe that lattice match is less critical if the insulator has the perovskite structure or the $K_2NiF_4$ structure. Among substrate materials that cna be used in the practice of the invention are $SrTiO_3$, $Mg_{1-x}Ca_xO$ ($0 \leq x \lesssim 0.15$), $BaZrO_3$, $Ba_2PbO_4$, $Ba_{1-x}Sr_xF_2$ ($0 \leq x \lesssim 0.35$), LiF and $LiBaF_3$, all either with or without a nucleation layer.

The above referred-to Ba- and Bi-containing oxide dielectrics preferably have nominal composition $BaBi_2O_{4+\delta}(0 \leq \delta \lesssim 0.25)$, $Ba_{1-x}M_xBiO_3$ (with M being K, Rb or mixtures thereof and $0 < x < 0.35$) or $Ba_{1+x}Bi_{1-x}O_{3-\delta}(0 \leq x \lesssim 0.5; 0 \leq \delta \lesssim 0.25)$. We have found that all of these dielectric materials can be grown by MBE. They typically can also be grown by other methods such as vapor deposition, sputtering, or laser ablation.

Among the above referred to Bi- and Ba-containing oxides are novel compositions which not only can advantageously serve as the dielectric in layer structures of the type relevant herein but which also have a variety of other uses. For instance, a layer of the novel oxide can serve as a nucleation layer for the growth of epitaxial bismuthate superconductor on a MgO(or other appropriate) body. Among the novel oxides are those of nominal composition $Ba_{1-x}M_xBi_2O_z$, $0 \leq x < 0.35$, and z being in the range 4–6. X-ray diffraction analysis of exemplary samples of these novel oxides has shown them to have an orthorhombic unit cell, with, exemplarily, $a \sim 0.435$ nm, $b \sim 4 \times 0.433$ nm = 1.733 nm, and $c \sim 2.230$ nm. The a and b lattice constants of the novel oxide thus are substantially compatible with the lattice constants of at least some bismuthate superconductors. Such lattice match is advantageous for the fabrication of layer structures according to the invention. Accordingly some preferred embodiments of the invention comprise a $Ba_{1-x}M_xBi_2O_z$ nucleation layer.

Disclosed herein are also advantageous methods of making s-i layer structures according to the invention. Some of the methods involve a change of the particle flux at an appropriate point during deposition of the s-i layer, and some of the methods involve a change of substrate temperature at an appropriate point during the deposition.

DETAILED DESCRIPTION

All known cuprate high $T_c$ superconductors are electrically anisotropic, and generally have much shorter coherence length associated with one crystallographic axis than is associated with the crystallographic plane (conventionally the ab-plane) normal to that axis. Furthermore, it has been discovered that significant magnetic fluctuations are present in many (if not all) cuprate superconductors. We believe that these and other properties of the known cuprate superconductors make it unlikely that substantially ideal BCS STJs can be made using cuprate high $T_c$ superconductors, since the above mentioned characteristics are likely to result in substantial pair breaking, which in turn is expected to lead to relatively low Josephson currents, and relatively small nonlinearity in the current-voltage characteristic, in agreement with experimental observation. As is well known, although there are some applications of STJs that do not require a substantial Josephson current, there are no applications of any current commercial interest that do not require at least a substantially non-linear I/V characteristic.

It is known that the bismuthate superconductors have cubic structure and thus are electrically isotropic. It has also been recognized that this isotropy potentially offers some advantages over the anisotropic cuprates. However, probably because of the comparatively low $T_c$ of $Ba_{0.6}K_{0.4}BiO_3$ and other known bismuthate superconductors, those skilled in the an have up to now largely disregarded these materials for potential commercial use.

Our discovery that s-i structures in which the superconductor layers are bismuthate superconductor layers can be used to manufacture substantially ideal BCS STJs by itself might not suffice to make these materials interesting for commercial use. However, we have also recognized that, at least in some applications, the comparatively low (compared to many cuprates) $T_c$ of these materials is not a significant disadvantage, since commercially available closed cycle refrigeration means can be used to cool and maintain these superconductors well below their $T_c$. Of course, structures according to the invention are not necessarily used in apparatus cooled by means of a closed cycle refrigerator. For instance, in order to attain extremely low noise operation it may at times be desirable to operate such structures at liquid He temperatures.

Figure 1:
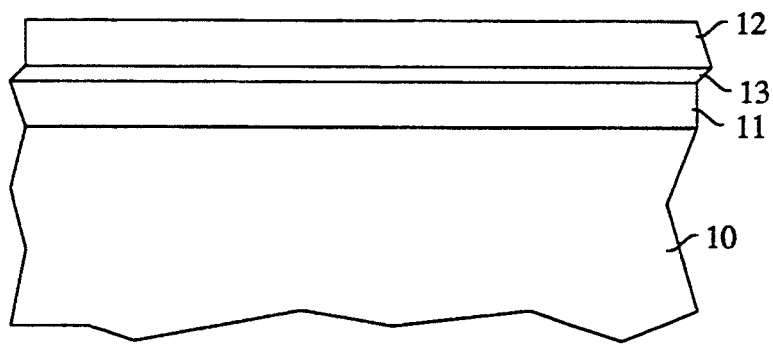
FIG. 1 schematically depicts a s-i-s layer structure on a substrate.

FIG. 1 schematically depicts an exemplary tri-level structure on an insulating substrate that can be an intermediate product in the process of making an article according to the invention. On substrate 10 (e.g., a MgO body having a planar major surface) is disposed a superconductor layer 11, on which are disposed dielectric layer 13 and further superconductor layer 12. Both superconductor layers comprise, and typically consist substantially ($\gtrsim 75\%$ by volume, frequently essentially 100%) of, bismuthate. In currently preferred embodiments the dielectric layer is an oxide that contains both Ba and Bi (exemplarily of nominal composition $Ba_{1-x'}M_{x'}Bi_2O_4$; with the optional M as well as $x'$ as previously defined). Another exemplary Ba- and Bi-containing insulator that can be used in the practice of the invention has nominal composition $Ba_{1-x}M_xBiO_3$, with M and $x$ also as previously defined. However, other dielectrics are not excluded, provided that the dielectric material has a lattice structure and relevant lattice constant that are compatible with oriented growth (preferably epitaxial growth) of the superconductor material on the dielectric. Preferably the relevant lattice constant of the dielectric material is within 3% (in some cases within 6%) of the lattice constant of the superconductor material. A close lattice constant match can frequently be achieved through co-deposition of two or more metal species. Exemplary possible dielectrics have been recited above.

The dielectric layer is not necessarily crystalline. Indeed, in some embodiments the chemical composition of the dielectric material is substantially the same as that of the superconducting bismuthate electrodes, but the dielectric material is disordered whereas the superconducting material is substantially ordered. This disorder may, for instance, be induced by means of exposure of the top surface of a bismuthate layer to an appropriate plasma, e.g., an Ar plasma.

Tri-level structures as described above can be made by known techniques, exemplarily evaporation, laser ablation, sputtering, and molecular beam epitaxy (MBE). Because of the high degree of control offered by MBE we currently prefer that technique. At least some of these methods can also be used to make multilayer s-i structures comprising at least two insulator layers, with each of these at least two insulator layers being disposed between two superconductor layers. Such multilayer structures will be referred to as s-i "superlattices".

S-i layer structures according to the invention that comprise a Ba- and Bi-containing oxide insulator layer and a bismuthate superconductor layer can exemplarily be made by a method that involves changing the flux composition at the s-i transition. However, such structures can also be made by a method that involves changing the temperature of the substrate at the s-i transition. This latter method utilizes the relatively low sticking coefficient of K (and/or Rb) at relatively high temperatures. Thus, it is possible to change the proportion of M (in a Ba-M-Bi oxide layer) by appropriately raising or lowering the substrate temperature during deposition of the layer. This method is particularly advantageous for sputter deposition, since in sputtering apparatus it is frequently easier to change substrate temperature than to change flux composition. Change of flux composition is, of course, possible in sputter deposition. It typically requires the use of two (or more) targets, each adapted to yield a deposit of the desired composition.

Figure 2:
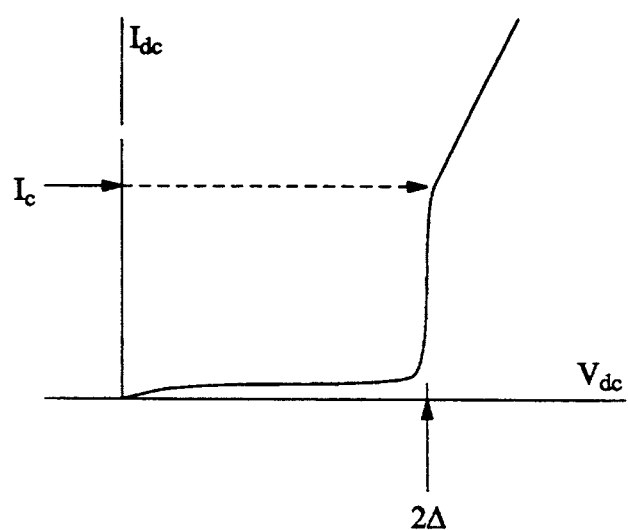
FIG. 2 shows an exemplary IN characteristic of a BCS STJ.

FIG. 2 shows an exemplary DC I/V characteristic of a (BCS) STJ, wherein $I_c$ is the Josephson current and $2\Delta e$ is the superconducting energy gap (e is the electron charge).

Figure 3:
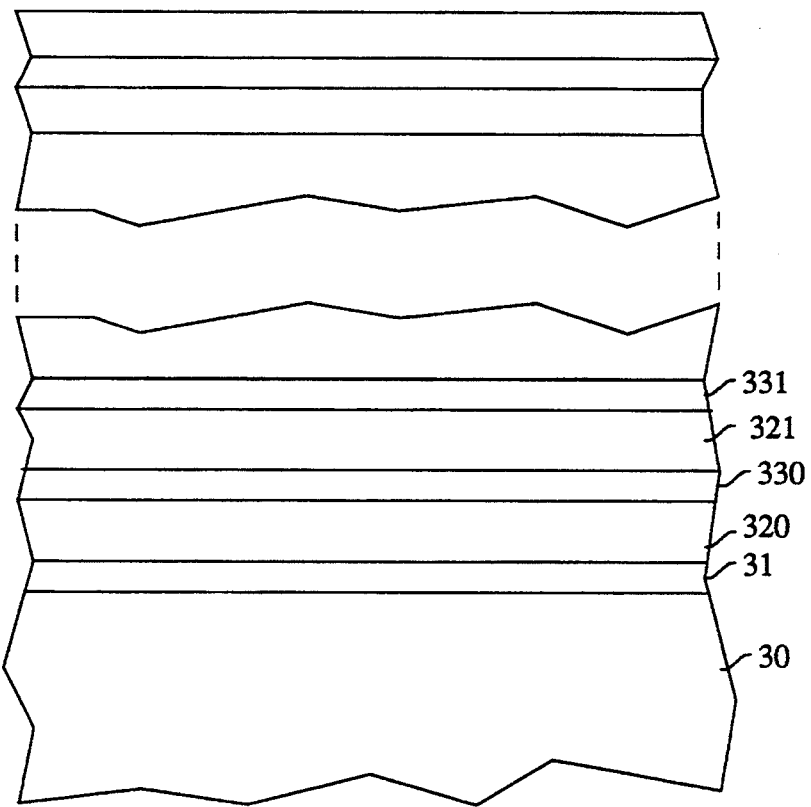
FIG. 3 schematically shows a s-i superlattice.

FIG. 3 schematically shows a portion of a s-i superlattice according to the invention, wherein numeral 30 refers to an appropriate substrate body, e.g., a MgO wafer, 31 refers to an (optional) nucleation layer, numerals 320,321, . . . to the multiplicity of superconductor layers, and numerals 330,331, . . . to the multiplicity of insulator layers.

Figure 4:
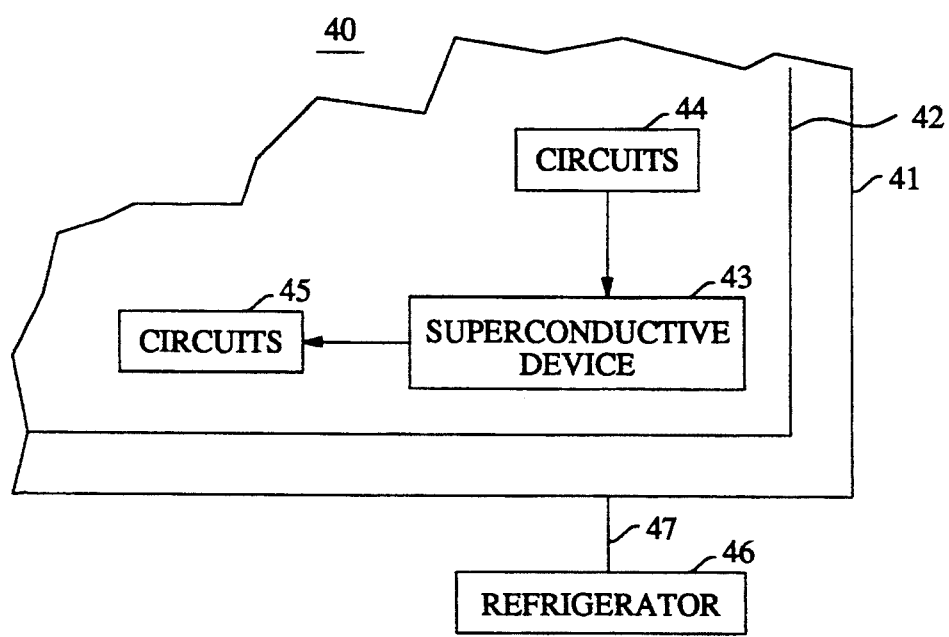
FIG. 4 schematically depicts relevant portions of an article according the invention.

FIG. 4 schematically shows a portion of an exemplary inventive article, a refrigerated electronic subassembly 40. Numeral 41 designates a chip carrier (exemplarily a circuit board or a Si wafer), 42 a substrate adapted for use with bismuthate superconductor material (e.g., a MgO wafer), 43 a device comprising a s-i layer structure according to the invention, and 44 and 45 designate electronic circuits that interact with device 43. Refrigerator 46 (e.g., a closed cycle refrigerator capable of attaining a temperature of about 10K) is heat-conductively connected to 41 by means of heat conductor 47, e.g., a copper braided ribbon.

Figure 5:
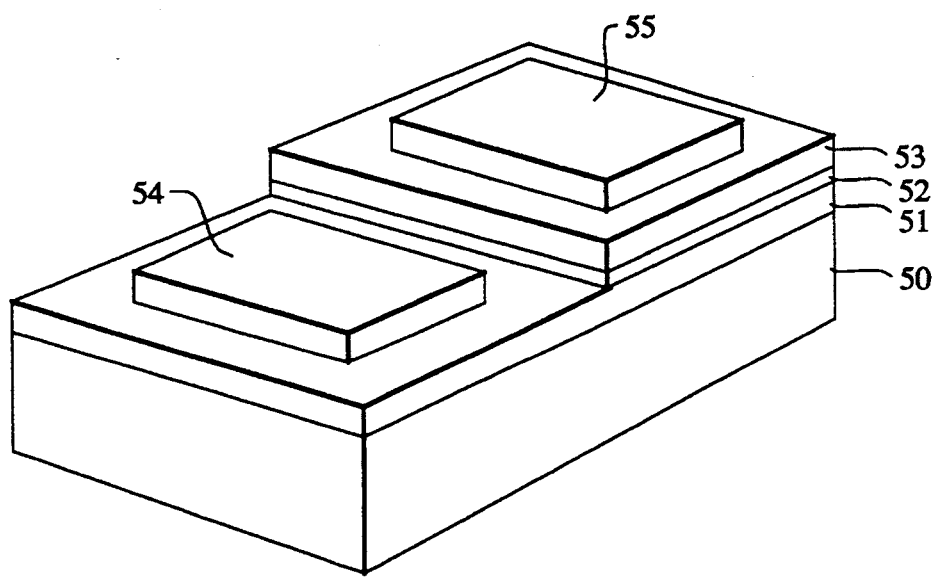
FIG. 5 schematically shows a STJ according to the invention.

FIG. 5 schematically depicts a s-i-s layer structure according to the invention that exemplarily forms a STJ. On substrate 50 is disposed lower bismuthate superconducting electrode 51, which is separated from upper bismuthate superconductor electrode 53 by insulator layer 52. Metal pads 54 and 55 facilitate electrically contacting of layers 51 and 53, respectively. It will be understood that substrate 50 need not be a uniform body but may have a layer structure, e.g., comprise a nucleation layer.

The currently preferred method of making articles according to the invention comprises providing an appropriate substrate, and exposing the substrate to a particle flux (comprising Ba, Bi, and oxygen, and optionally comprising previously defined M) such that a first material layer containing Ba, Bi, and oxygen, (and optionally containing M) is formed on the substrate. It also comprises changing the relative amount of at least one of Ba, Bi, and the optional M in the flux and/or changing the substrate temperature, and exposing the substrate with the first material layer thereon to the flux such that a second material layer is formed on the first material layer. One of the two layers is a Ba- and Bi-containing insulator layer (typically having a M:Ba ratio in the range 0–0.53), and the other of the two layers is (or is adapted to being transformed into) a bismuthate superconductor layer of nominal composition $Ba_{1-x}M_xBiO_{3-y}$, (with M, x and y as previously defined). By a layer that is "adapted for being transformed into" a superconductor layer of a given composition we mean a layer that contains all the metal constituents in the appropriate ratios but differs from the given composition with regard to oxygen content, such that the layer can be transformed into a superconductor layer by means of an appropriate heat treatment, typically in an oxygen-containing atmosphere at a temperature below about 500° C.

It will be understood that the above referred to appropriate substrate can be a composite substrate, exemplarily comprising a body such as a MgO wafer and a nucleation layer on a major surface of the body. The nucleation layer typically is a Ba- and Bi-containing insulator layer (with M:Ba ratio in the range 0–0.53) produced in situ. It will also be understood that the substrate typically is at an elevated temperature (typically in the range 150–450° C.) during at least a pan of the deposition process.

As indicated above, the transition from the first layer to the second layer can be brought about through a change in flux composition (e.g., by shuttering the M source and/or by opening an additional Bi source, or by switching to a different sputtering target), and/or by a change in substrate temperature. For instance, if the first layer is a superconductor layer ($x \sim 0.4$) that is being deposited at 300° C., then the insulator layer can be deposited (without changing the flux composition) at a temperature in the range 400–450° C.

An alternative method of making an article according to the invention comprises exposing the substrate to an appropriate particle flux such that a crystalline layer of the desired bismuthate is formed, terminating exposure to the flux, and causing the top portion of the crystalline layer to be transformed into substantially disordered material, such that the top portion of the layer becomes electrically insulating. This transformation is conveniently accomplished through exposure of the layer surface to a plasma.

In addition to the above described steps, the method according to the invention typically comprises one or more conventional steps such as metalization, photolithography, etching, encapsulating, and/or testing. These do not require detailed discussion.

The remainder of the discussion herein will primarily involve structures formed by MBE. This is done for the sake of concreteness and does not imply any limitation. General growth techniques are described in E. S. Hellman et al., *Applied Physics Letters*, Vol. 55 (20), pp. 2120–2122 (1989); and E. S. Hellman et al., *Journal of Vacuum Science and Technology*, Vol. B8(2), pp. 332–335 (1990), both incorporated herein by reference.

The former inter alia ". . . reports the successful growth of epitaxial (Rb, Ba)BiO$_3$ thin films on MgO and SrTiO$_3$ substrates. . .", and also reports that such films 37 . . .can be grown at temperatures below 350° C. . . .". The reference inter alia discloses experimental data (e.g. FIG. 4) that establishes that an epitaxial (Rb,Ba)BiO$_3$ film on SrTiO$_3$ was superconducting with T$_c$ (90%) of 23.8K, and with T$_c$ (R=0) of about 21K. The latter reference discloses epitaxial growth of (Rb, Ba)BiO$_3$ films of MgO at temperatures as low as 300° C, and also discloses that ". . . no post-growth annealing is required to obtain the superconducutors."

EXAMPLE 1

A s-i-s layer structure was grown on a (100) oriented MgO substrate in a commercially available (Riber) MBE system with an RF plasma atomic oxygen source. The substrate was heated to 475° C. and exposed for 10 minutes to fluxes from effusion cells containing Ba and Bi metal, respectively, and to an atomic oxygen flux from the plasma source. The fluxes were chosen such that the resulting nucleation layer had nominal composition BaBi$_2$O$_{4+\delta}$ ($0 < \delta \lesssim 2$). In situ RHEED analysis indicated that the thus grown nucleation layer was epitaxial with the substrate and had a very smooth surface. Subsequently the substrate temperature was lowered to 325° C. and the nucleation layer exposed to Ba, K, Bi and oxygen fluxes, with the Ba, Bi, and oxygen fluxes being as used during nucleation layer deposition, and the K flux (from a K$_2$O - containing magnesia crucible fitted to a standard effusion cell; K$_2$O was produced by heating a quantity of KO$_2$ to 300° C. in a sealed quartz ampule with excess K metal) adjusted to result in bismuthate film of nominal composition Ba$_{0.65}$K$_{0.35}$BiO$_3$. Maintaining these conditions for 45 minutes resulted in a 220 nm thick bismuthate film. At this point the potassium shutter was closed for 1 minute, resulting in the growth of a (approximately 4 nm) BaBi$_2$O$_{4+\delta}$ barrier layer. Opening the shutter again resulted in growth of the top bismuthate layer. After 30 minutes deposition was terminated (the resulting layer was 150 nm thick), the sample was allowed to cool to room temperature and was removed from the MBE system. Rutherford backscattering spectroscopy (RBS) confirmed that the thus deposited multilayer structure was epitaxial, and also confirmed the presence, at the expected depth, of a layer of reduced K-concentration (i.e., the barrier layer).

EXAMPLE 2

A bismuthate film of nominal composition Ba$_{0.6}$K$_{0.4}$BiO$_3$ was grown on, a MgO substrate substantially as described in Example 1, except that, after termination of the growth, the sample was annealed in oxygen at 375° C. for 90 minutes, followed by a slow cool in oxygen. The resulting film had room temperature resistivity less than 1mΩ·cm, a transition temperature (T$_c$) of about 24K, and a transition width of about 1K.

EXAMPLE 3

A s-i superlattice (24 layer pairs) was made by a technique substantially as described in Example 1. The bismuthate superconductor layer were nominally 4.0 nm each, and the dielectric layers were nominally 2.0 nm each. X-ray diffraction analysis revealed the presence of the diffraction sidebands expected from a superlattice as described.

EXAMPLE 4

A STJ is made by processing a s-i-s structure grown substantially as described in Example 1. In particular, the desired junction geometry is defined by means of conventional photolithography and produced by conventional ion milling through the s-i-s structure to the substrate. Next, the geometry of the top electrode is defined by conventional lithography, followed by removal of the unwanted top electrode portions and barrier layer portions by conventional ion milling. A gold layer is then deposited to make ohmic contact to the top and bottom electrode, and is patterned by conventional lift-off of photoresist. The resulting STJ has an I/V characteristic substantially as shown in FIG. 2.

EXAMPLE 5

A s-i-s layer structure is grown substantially as described in Example 1 except that, completion of the deposition of the bottom superconductor layer, the Ba, Bi and K fluxes are terminated, the oxygen plasma source is shut off, and BaF$_2$ is evaporated from a BaF$_2$ source. After about 1 minute the evaporation is terminated and the previous conditions are re-established, resulting in growth of the top superconductor layer. The dielectric layer has nominal composition BaF$_2$ and a thickness of about 2 nm.

EXAMPLE 6

An s-i-s layer structure was grown substantially as described in Example 1 except that, after deposition of the bottom superconductor layer, the Bi and K fluxes were terminated and a Pb flux was initiated. The Pb flux was set such that the deposited material had composition Ba$_2$PbO$_4$. After growth of a 10 nm Ba$_2$PbO$_4$ layer the Pb flux was terminated and the Bi and K fluxes were re-established.

EXAMPLE 7

A bismuthate superconductor layer is grown substantially as described in Example 1. When the layer has reached the desired thickness the fluxes are terminated and the surface is exposed to a beam of ionized argon (300 eV, 1 mA/cm$^2$) for 45 seconds. This exposure results in reduced crystalline order of the near-surface region of the bismuth layer such that the region is rendered insulating, yet still able to support epitaxial growth of the top bismuthate superconductor layer. After completion of the Ar bombardment the Ba, Bi, K and oxygen flux is re-established and the top bismuthate superconductor layer is deposited substantially as described.

We claim

1. An article comprising a layer structure disposed on at least a portion of a substrate, said layer structure comprising at least one superconductor layer in contact with an insulator layer, associated with the superconductor material being a transition temperature T$_c$;

Characterized in that a) the superconductor material has nominal composition Ba$_{1-x}$M$_x$BiO$_{3-y}$, with M selected from the group consisting of K, Rb, and K and Rb, with $0.35 \leq x \lesssim 0.5$, and with $0 \leq y \lesssim 0.25$;

b) the insulator material is crystalline material selected from the group consisting of i) LiBaF$_3$, BaO, BaZrO$_3$, Ba$_2$PbO$_4$, LiF, CaO, MgO, BaF$_2$, SrF$_2$;

ii) BaBi$_2$O$_{4+\delta}$, with $0 \leq \delta \lesssim 0.25$;

iii) Ba$_{1-x}$M$_x$BiO$_3$, with M being K, Rb, or K and Rb, and $0 \leq x \lesssim 0.35$;

iv) Ba$_{1+x}$Bi$_{1-x}$O$_{3-\delta}$, with $0 \leq x \lesssim 0.5$, and $0 \leq \delta \lesssim 0.25$;

v) Ba$_{1-x}$M$_x$Bi$_2$O$_z$, with M being K, Rb, or K or Rb, $0 \leq x \lesssim 0.35$, and $4 \lesssim z \lesssim 6$;

vi) Mg$_{1-x}$Ca$_x$O, with $0 \leq x \lesssim 0.15$; and vii) Ba$_{1-x}$Sr$_x$F$_2$, with $0 \leq x \lesssim 0.35$;

c) said superconductor layer is substantially epitaxial with the substrate and is intermediate the substrate and the insulator layer; and d) said insulator layer is substantially epitaxial with the superconductor layer.

2. An article according to claim 1, further comprising closed cycle refrigeration means adapted for cooling at least a portion of the substrate with the layer structure thereon to a temperature below T$_c$.

3. An article according to claim 1, wherein the substrate comprises a body having a major surface, and further comprises a Ba- and Bi-containing insulator layer disposed on the major surface, said Ba- and Bi-containing insulator layer to be designated the nucelation layer, with the at least one superconductor layer disposed on the nucleation layer and substantially epitaxial therewith.

4. An article according to claim 3, wherein the nucleation layer material has nominal composition Ba$_{1-x}$M$_x$Bi$_2$O$_{4+\delta}$, with the optional M selected from the group consisting of K, Rb, and combinations thereof, $0 \leq x \lesssim 0.35$, and $0 \leq \delta \lesssim 0.25$.

5. An article according to claim 1, wherein the said layer structure comprises a multiplicity of superconductor layers.

6. An article according to claim 5, wherein the said layer structure comprises a superconducting tunnel junction that comprises a bottom and a top superconductor layer, with the insulator layer therebetween.

7. An article according to claim 6, wherein the dielectric layer is of thickness 4 nm or less.

8. An article according to claim 1, wherein the substrate comprises material having an epitaxy-relevant lattice constant that differs by at most 6% from the lattice constant of the superconductor material, and wherein the superconductor material has T$_c$ greater than 15K.

9. An article according to claim 1, wherein the substrate comprises material selected from the group consisting of MgO and SrTiO$_3$.

* * * * *